United States Patent [19]

DiVincenzo

[11] Patent Number: 4,711,800
[45] Date of Patent: Dec. 8, 1987

[54] NEEDLECRAFT WITH METALLIC SUBSTRATE

[76] Inventor: Maureen DiVincenzo, 1003 Wachusett St., Holden, Mass. 01520

[21] Appl. No.: 741,755

[22] Filed: Jun. 6, 1985

[51] Int. Cl.<sup>4</sup> .................. B32B 3/10; C23F 1/02; B44C 1/22
[52] U.S. Cl. .................. 428/131; 156/634; 156/644; 156/654; 156/661.1; 428/134; 428/596; 428/7; 430/323
[58] Field of Search ............ 156/644, 654, 656, 659.1, 156/661.1, 664, 634, 93, 150; 428/7, 28, 596, 131, 134, 136, 137, 613, 615; 112/222, 78, 224, 262.2; 430/313, 318, 312, 323; 204/15, 24

[56] References Cited
U.S. PATENT DOCUMENTS

| | | | |
|---|---|---|---|
| 3,813,310 | 5/1974 | Droege et al. | 156/644 X |
| 3,959,527 | 5/1976 | Droege | 156/645 X |
| 4,215,194 | 7/1980 | Shepherd | 156/659.1 X |
| 4,578,318 | 3/1986 | Schoch et al. | 156/666 X |

Primary Examiner—William A. Powell
Attorney, Agent, or Firm—Blodgett & Blodgett

[57] ABSTRACT

A method of forming a substrate for needlecraft comprising the steps of providing a planar sheet of metal of a desired shape and size and chemically etching the sheet of metal from both planar surfaces at predetermined to areas to form a pattern of apertures which are suitable for embroidering with thread. The invention also comprises a substrate formed by the above method. The invention further comprises a craft item which is formed by the application of thread to the apertures of the metallic substrate which is formed by the above method.

23 Claims, 8 Drawing Figures

NEEDLECRAFT WITH METALLIC SUBSTRATE

BACKGROUND OF THE INVENTION

The present application relates generally to the art of needlecraft and, more specifically, to the arts of embroidery and metalcraft.

The art of embroidery involves the application of colored threads to fabric by needles to form a desired pattern on one surface of the fabric. The pattern may be decorative, abstract or representive. In many cases, a pattern is printed on one surface of the fabric and the thread is applied to the fabric by following the pattern. Skilled practioners of the art of embroidery prefer to work with plain fabric and create their own patterns and designs.

The art of metalcraft includes the formation of metal into decorative patterns or art forms. Metal art objects are formed by casting, forging, or stamping. A more specialized metalcraft includes stamping or otherwise forming a planar sheet of metal into a desired shape and thereafter etching a decorative pattern on the planar surfaces of the sheet or, occasionally, etching entirely through the sheet. This later technique has been used, for example, to create christmas tree ornaments. The art of metalcraft and the art of embroidery have always existed as essentially separate art forms.

It is, therefore, a principal object of the invention to provide an art form which combines the art of embroidery and the art of metalcraft.

Another object of this invention is the provision of a planar metallic substrate for the art of embroidery.

A further object of the present invention is the provision of a planar metallic substrate having a pattern of apertures which enable the substrate to be used for embroidery.

It is another object of the present invention to provide a method of forming a planar metal substrate for the art of embroidery.

A still further object of the invention is the provision of a method of forming a needlecraft item which includes forming a planar metallic substrate and the application of decorative thread to the substrate.

With these and other objects in view, as will be apparent to those skilled in the art, the invention resides in the combination of parts set forth in these specification and covered by the claims appended hereto.

SUMMARY OF THE INVENTION

In general, the invention consists of a method of forming a substrate for needlecraft comprising the steps of preparing a planar sheet of metal of a desired size and shape and chemically etching the sheet of metal from both planar sides at predetermined areas to form a pattern of apertures in the sheet. The invention also comprises a needlecraft substrate which is made in the accordance with the above recited method. The invention further includes a craft item comprising a planar metallic substrate having a plurabilty of apertures which form a predetermined pattern and thread which is stitched through the apertures to form a predetermined pattern on one of the planar surfaces of the substrate. It is also possible that the sheet could be rendered non-planar before or after stitching.

BRIEF DESCRIPTION OF THE DRAWINGS

The character of the invention, however, may be best understood by reference to one of its structual forms, as illustrated by the accompanying drawings, in which.

DESCRIPTION OF THE PREFERRED EMBODIMENT

Figure 4:
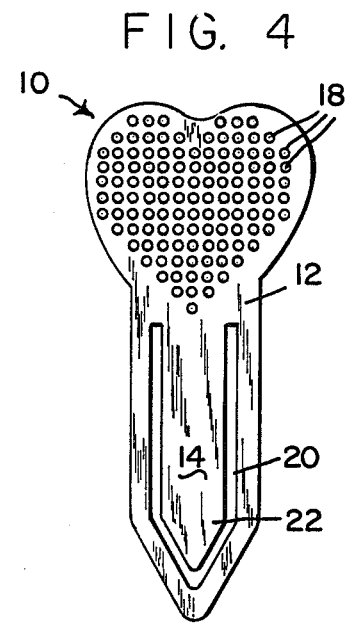
FIG. 4 is a plan view of the substrate of the present invention.

Referring first to FIG. 4, the substrate of the present invention is generally indicated by the reference numerial 10 and includes a planar sheet of metal or metal base 12 having a predetermined shape or outline. The shape of metal base 12 which is shown in FIG. 4 represents only one example of many possible shapes which the metal base can have. The metal base 12 also has a plurality of apertures 18 which are arranged in a predetermined pattern or array which is suitable for subsequent embroidering. If desired, the metal base 12 may contain other apertures or open areas for design or utilitarian purposes. In the example shown in FIG. 4, the metal base 12 includes a U-shaped aperture 20, which forms a tab that enables the substrate 10 to function as a decorative bookmark. The metal base 12 has a top planar surface 14 and a bottom planar surface 16, see FIG. 6. The apertures 18 and 20 are formed by a photo etching process to be described.

Figure 2:
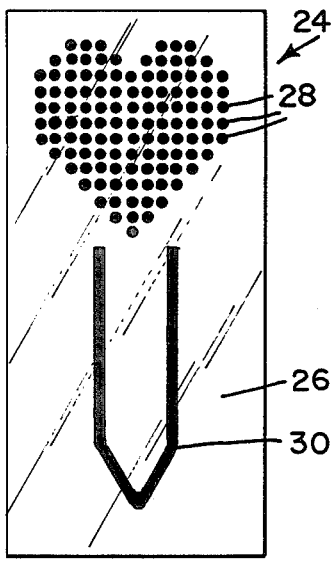
FIG. 2 is a plan view of a mask to be used with the metal base of FIG. 1 for forming the substrate of the present invention.

Referring to FIG. 2 there is shown a mask, generally indicated by the reference numerial 24, which is used in the photo etching proces for forming the apertures 18 and 20 of the metal base 12. Mask 24 consists of a piece of clear plastic film having clear areas 26 and opaque or photopositive areas 28 and 30. The opaque areas 28 comprise a pattern of dots which correspond to the apertures 18 of the substrate 10. The opaque area 30 is U-shaped and corresponds to the U-shaped aperture 20 in the substrate 10.

Figure 1:
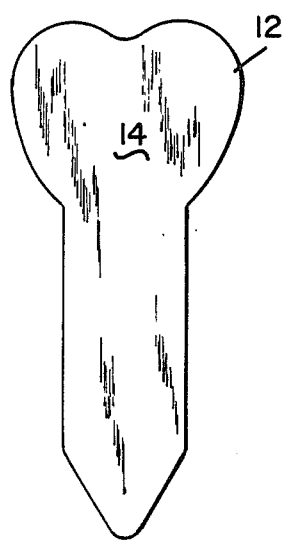
FIG. 1 is a plan view of a metal base having the general shape of the substrate of the present invention.
Figure 5:
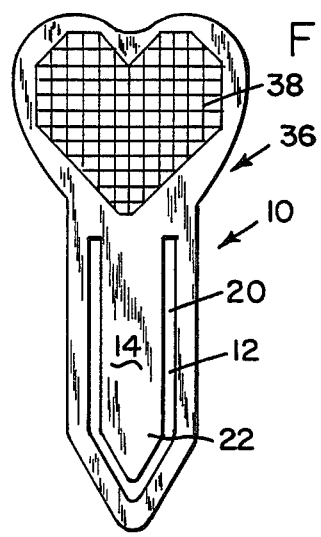
FIG. 5 is a plan view of the substrate of FIG. 4 with thread applied thereto to form the finished craft item.
Figure 8:
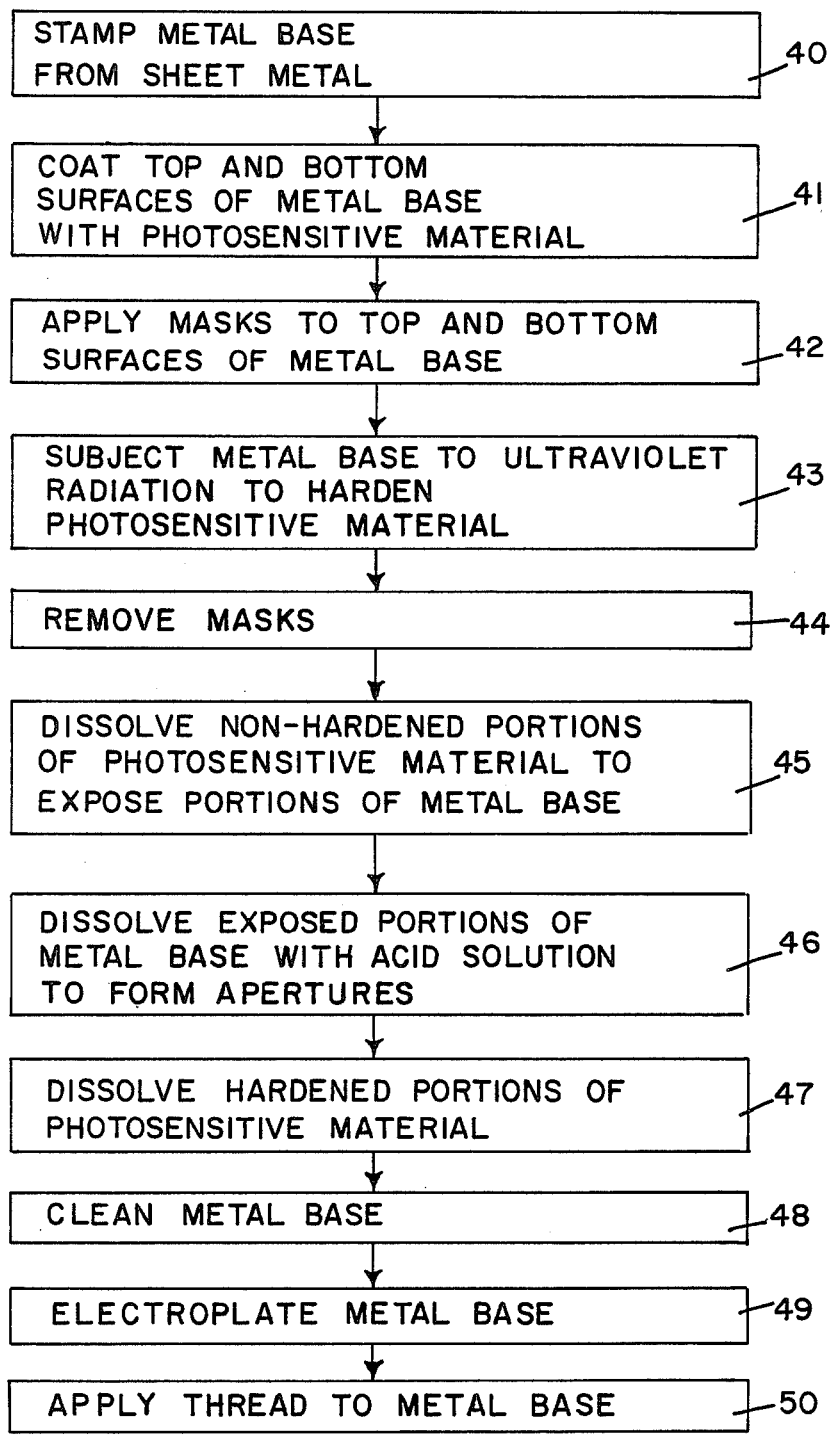
FIG. 8 is a flow chart showing the steps of forming the substrate and subsequent craft item of the present invention.

The steps of forming the substrate 10 and the subsequent craft article shown for example in FIG. 5 and generally indicated by the reference numerial 36 are diagrammatically illustrated in a flow chart of FIG. 8. Referring first to block 40 of FIG. 8 and FIG. 1, the first step consists of stamping or cutting the metal base 12 from sheet metal so that the metal base has the desired size and general outline of the finished craft item as shown, for example, in FIG. 1.

Figure 6:
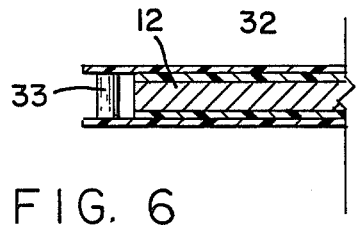
FIG. 6 is a vertical cross sectional view taken along the line VI—VI of FIG. 3 on an enlarged scale with portions broken away.
Figure 7:
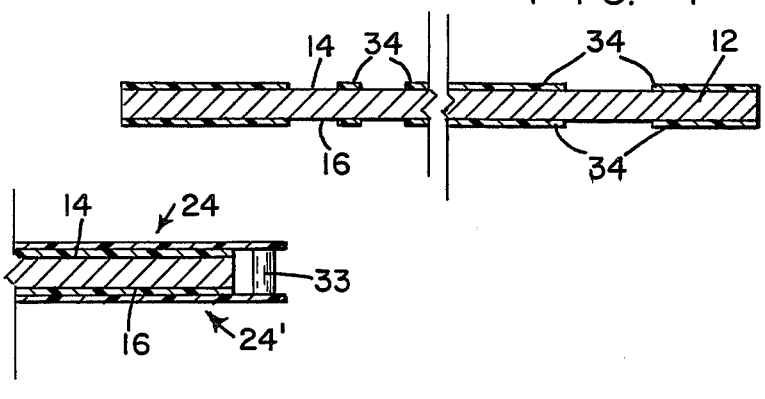
FIG. 7 is a view similar to FIG. 6 with the masks removed and the non-hardened portions of the photosensitive coatings on the planar surfaces of the metal base dissolved.

The second step, as indicated in block 41 of FIG. 8, consists of coating the top and bottom planar surfaces 14 and 16 with photosensitive material, this material is commonly referred to in the photo etching trade as photoresist. The photoresist may be liquid or dry film. A dry film substance which has given excellent results is sold under the trademark "Dynachem" and is sold by Dynachem Corporation of Santa Ana, Calif. This material hardens or cures when subjected to ultraviolet radiation so that it will not be dissolved by a relatively weak alkaline solution which is capable of dissolving unhardened film. However, the hardened photoresist film is capable of being dissolved by a relatively strong alkaline solution. The photoresist film, indicated by the reference numeral 32 in FIG. 6, is applied to the upper and lower planar surfaces 14 and 16 of the metal base 12.

Figure 3:
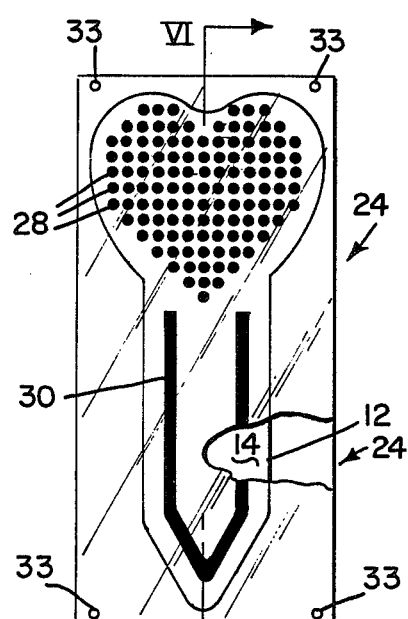
FIG. 3 is a plan view of the mask of FIG. 2 applied to the metal base of FIG. 1

Referring to block 42 of FIG. 8, the next step of the process consists of applying a mask to the top and bottom surfaces 14 and 16, respectively, of the metal base 12. The mask 24 is applied to the top surface 14 and a similar mask 24' is applied to the bottom surface 16. The pattern of opaque areas in the mask 24' is a mirror image of the pattern of opaque areas in the mask 24. However, in the case of a symmetrical pattern of opaque areas such as that shown in mask 24, the masks 24 and 24' are identical. It is essential that the pattern of opaque areas 28 and 30 of both masks be vertically aligned. This can be accomplished, for example, by the use of locating pins 33, see FIGS. 3 and 6.

After the masks 24 and 24' have been applied to the metal base 12, it is subjected to ultraviolet radiation, see block 43 of FIG. 8. The ultraviolet radiation passes through the clear or transparent areas 26 of each mask and cures or hardens the photosensitive of photoresist material which abuts the transparent areas. The opaque areas of the mask block the ultraviolet radiation, so that the photoresist material which abutts the opaque areas remains uncured or unhardened.

The masks 24 and 24' are then removed as indicated by block 44 and the stamping 13 is subjected to a mild alkaline solution such as bicarbonate of soda, as indicated by block 45. The solution of bicarbonate of soda is effective to dissolve the non-hardened portions of the photoresist material, this exposes the surface of the metal base 12 wherever there was non-hardened photoresist material. As a result, the exposed areas of each planar surface of the metal base 12 correspond with the opaque areas of the corresponding mask which was applied to that surface.

The metal base 12 is then subjected to an acid solution, as indicated by block 46. This dissolves the exposed portions of the metal base. Since the exposed I5 surface areas of one planar surface of the metal base 12 are aligned with the identical exposed surface areas of the opposite planar surface of the metal base, the acid solution eat through the metal from both sides and produces apertures in the metal base, thereby resulting in the substrate 10 shown in FIG. 4. The pattern of apertures 18 of the substrate 10 corresponds to the opaque areas 28 of the mask 24 which is shown in FIG. 2. The U-shaped aperture 20 corresponds to the U-shaped opaque area 30 of the mask 24. The type of acid which is used for etching depends on the metal composition of the metal base 12, for example, ferric chloride is used for etching brass or aluminum and nitric iodine for etching silver.

After etching, the hardened photoresist material is dissolved, as indicated by block 47, with a relatively stong alkaline solution. Excellent results have been obtained with the use of butyl carbitol.

After the metal base 12 has been cleaned, as indicated by block 48, it is electroplated, as indicated by block 49. Electroplating a brass metal base with gold or silver produces a finished highly attractive substrate for use as a needle craft item.

The pattern of apertures 18 enables a thread 38 to be embroidered or stitched to the substrate, thereby producing a finished craft, item indicated by the reference numerial 36 in FIG. 5. As shown in FIG. 5, the apertures 18 are covered by the embroidered thread 38. The embroidery may include several colored threads which are arranged in any desired decorative pattern. The present invention enables an infinite variety of needlecraft items to be created. The bookmark shown in FIG. 5 represents one example of the type of needle craft item which may be formed in accordance with the present invention. Other craft items include necklaces, and christmas tree ornaments. Also, an infinite number of designs is possible for each of these general catagories.

The form of needlecraft for which this invention is best suited is cross-stitching. In that case, the apertures would be in the pattern shown in the drawings, would be 14 or 18 count (holes per inch), and would be large enough for a No. 24 cross-stitch needle.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by the Letters Patent is:

1. Method of forming a substrate for needlecraft comprising the steps of:
  (a) providing a sheet of metal of the desired size and shape, said sheet having a top surface and a bottom surface,
  (b) coating each of said top and bottom surface with a photosensitive material which hardens when exposed to ultraviolet light,
  (c) applying a transparent mask to the coating on each to at least one of said top and bottom surfaces, said mask having areas which are opaque to ultraviolet light and which represent a desired pattern,
  (d) subjecting both of said mask covered coating surface and said non-mask covered coating surface to ultraviolet radiation to harden the portions of each of said coatings which lie outside of the opaque areas of the mask,
  (e) subjecting said sheet of metal to a solution which dissolves the unhardened portions of each coating,
  (f) subjecting said sheet of metal to an acid solution which dissolves metal from both surfaces at the areas of the sheet which are not covered by the hardened coating, so that apertures are formed in said sheet at said areas,
  (g) subjecting said sheet of metal to a solution which dissolves the hardened portions of each coating, wherein the said patterns are adapted so that the said apertures comprise a plurality of closely-spaced, small-diameter, generally circular opening, of the type and arrangement used for needlecraft cross-stitching, and (h) electroplating the substrate after removal of the hardened portions of said coating of photosensitive material.

2. A method as recited in claim 1, wherein the openings are spaced approximately 14 to 18 openings per inch and are of sufficient size to pass a number 24 cross-stitch needle.

3. Method of forming a substrate as recited in claim 1 wherein each of said surfaces is coated by applying a solid plastic film to the surface.

4. Method of forming a substrate as recited in claim 3, wherein said plastic film in the unhardened state, is capable of bieng dissolved by a relatively weak alkaline solution which is incapable of dissolving the hardened portions of the film and, wherein the hardened portions of said plastic film is capable of being dissolved by a relatively strong alkaline solution.

5. Method of forming a substrate as recited in claim 4, wherein said relatively weak alkaline solution is bicarbonate of soda and said relatively strong alkaline solution is butyal carbitol.

6. Method of forming a substrate as recited in claim 1, wherein said mask is a transparent solid plastic sheet having opque areas which represent desired pattern.

7. Method of forming a substrate as recited in claim 1, wherein said sheet of metal is brass and said acidic solution is ferric chloride.

8. Method of forming a needlecraft item comprising the steps of:
   (a) providing a sheet of metal of a desired size and shape, said sheet having a top surface and a bottom surface,
   (b) chemically etching the sheet of metal from both of said surfaces at predetermined areas to form a pattern of apertures said pattern of apertures comprising a large number of closely-spaced, small-diameter, generally circular apertures arrange in a manner appropriate for cross-stitching, thereby forming a substrate, and
   (c) applying decorative thread to said substrate by stitching the thread through said apertures.

9. Method of forming a needle craft item as recited in claim 8, comprising the step of electroplating said surfaces, after the formation of said apertures and prior to the step of applying decorative thread to said substrate.

10. Craft item comprising:
    (a) a metallic substrate having a predetermined size and shape, said having a top surface and a bottom surface, said substrate having a plurality of apertures which extend through the substrate from said top surface to said bottom surface said appertures being arranged in a predetermined pattern, and
    (b) at least one thread which is stitched through said apertures to form a predetermined needlecraft pattern on said top surface.

11. Craft item as recited in claim 10, wherein said substrate comprises:
    (a) a base of a non-previous metal
    (b) a plating of a second precious metal covering said non precious metal.

12. Craft item as recited in claim 11, wherein said apertures are formed by chemical etching so that the edges of the apertures are smooth.

13. Craft item as recited in claim 10, wherein the said substrate is planar.

14. Craft item as recited in claim 10, wherein the said predetermined pattern comprises a large number of closely-spaced, small-diameter, generally-circular apertures arranged of the type and arrangement used in needlecraft.

15. Craft item as recited in cliam 14, wherein the apertures are spaced between 14 to 18 per inch.

16. Craft item as recited in claim 14, wherein the aperture are only sufficiently large to pass a number 24 cross-stitch needle.

17. Craft item kit comprising:
    (a) a metallic substrate having a predetermined size and shape, said having a top surface and a bottom surface, said substrate having a plurality of apertures which extend through the substrate from said top surface to said bottom surfce said appertures being arranged in a predetermined pattern, and
    (b) at least one thread adapted to be stitched through said apertures to form a predetermined needlecraft pattern on said top surface.

18. Craft item kit as recited in claim 17, wherein said substrate comprises:
    (a) a base of a non precious metal
    (b) a plating of a second previous metal covering said non preious metal.

19. Craft item kit as recited in claim 17, wherein said apertures are formed by chemical etching so that the edges of the apertures are smooth.

20. Craft item as recited in claim 17, wherein the said substrate is planar.

21. Craft item as recited in claim 17, wherein the said predetermined pattern comprises a large number of closely-spaced, small-diameter, generally-circular apertures arrange of the type and arrangement used in needlecraft.

22. Craft item as recited in claim 21, wherein the apertures are spaced between 14 to 18 per inch.

23. Craft item as recited in claim 21, wherein the aperture are only sufficiently large to pass a number 24 cross-stitch needle.

* * * * *